United States Patent [19]
Roberts et al.

[11] Patent Number: 5,840,402
[45] Date of Patent: Nov. 24, 1998

[54] METALLIZED LAMINATE MATERIAL HAVING ORDERED DISTRIBUTION OF CONDUCTIVE THROUGH HOLES

[75] Inventors: Sidney J. Roberts, Dennison; Eugene T. Selbitschka, South St. Paul, both of Minn.; Glenn W. Gengel, Longmont, Colo.; Brent N. Sweitzer, Nerstrand, Minn.

[73] Assignee: Sheldahl, Inc., Northfield, Minn.

[21] Appl. No.: 265,649

[22] Filed: Jun. 24, 1994

[51] Int. Cl.$^6$ ..................................................... B32B 3/00
[52] U.S. Cl. ........................... 428/131; 428/140; 428/335; 428/458; 428/460; 428/469; 428/901; 174/250; 174/255; 174/257; 361/748; 361/749; 361/750; 361/751; 29/853
[58] Field of Search ........................................ 428/131, 140, 428/458, 460, 469, 901, 335; 174/250, 255, 257; 361/748, 749, 750, 751; 29/853

[56] References Cited

U.S. PATENT DOCUMENTS

| | | | |
|---|---|---|---|
| 2,994,846 | 8/1961 | Quinn | 338/308 |
| 3,061,760 | 10/1962 | Ezzo | 317/100 |
| 3,296,099 | 1/1967 | Dinella | 204/15 |
| 3,464,855 | 9/1969 | Shaheen et al. | 117/212 |
| 3,487,268 | 12/1969 | Ljungdell et al. | 317/101 |
| 3,530,259 | 9/1970 | Burke, Jr. | 174/68.5 |
| 3,531,579 | 9/1970 | Katz | 174/68.5 |
| 3,546,539 | 12/1970 | Wilcox, Jr. et al. | 317/101 |
| 3,568,312 | 3/1971 | Perricone | 29/625 |
| 3,626,081 | 12/1971 | Little | 174/68.5 |
| 3,691,632 | 9/1972 | Smith | 29/625 |
| 3,791,858 | 2/1974 | McPherson et al. | 117/201 |
| 3,798,060 | 3/1974 | Reed et al. | 117/212 |
| 3,819,430 | 6/1974 | Dugan | 156/3 |
| 3,825,999 | 7/1974 | Rubey | 29/626 |

(List continued on next page.)

FOREIGN PATENT DOCUMENTS

| | | |
|---|---|---|
| 0 239 033 | 9/1987 | European Pat. Off. . |
| 46-37981 | 11/1971 | Japan . |
| 47-43908 | 11/1972 | Japan . |
| 51-107469 | 9/1976 | Japan . |
| 54-102567 | 8/1979 | Japan . |
| 56-1598 | 1/1981 | Japan . |
| 6407079 | 6/1964 | Netherlands . |
| 7115480 | 5/1972 | Netherlands . |
| 915181 | 1/1963 | United Kingdom . |
| 929096 | 6/1963 | United Kingdom . |
| 1013606 | 12/1965 | United Kingdom . |
| 1124298 | 8/1968 | United Kingdom . |
| 93/26143 | 12/1993 | WIPO . |

OTHER PUBLICATIONS

M. M. Haddad, "Multilayer Printed Circuit Panel", IBM Technical Disclosure Bulletin, vol. 12, No. 8, Jan. 1970, pp. 1191–1192.

C. N. Sprott, "Forming Patterns", IBM Technical Disclosure Bulletin, vol. 10, No. 12, May 1968, pp. 1851–1852.

M. Zipay et al., "Fabrication on Multilayered Structures", IBM Technical Disclosure Bulletin, vol. 12, No. 10, Mar. 1970, p. 1960.

*Primary Examiner*—Stevan A. Resan
*Attorney, Agent, or Firm*—Merchant, Gould, Smith, Edell, Welter & Schmidt, P.A.

[57] ABSTRACT

A metallized laminate material for the manufacture of high performance, high density printed wiring boards and the like includes an ordered distribution of via holes electrically interconnecting opposing conductive layers on a dielectric polymeric film substrate. Furthermore, opposing photoresist layers substantially cover the conductive layers and vias. The conductive material in the conductive layers and the vias is bonded adhesivelessly to the substrate to provide a high degree of delamination resistance. The production of metallized laminate material is preferably carried out in a roll-to-roll process suitable for high volume, low cost production. In use, an end user may manufacture customized printed wiring boards in small volume runs from the laminate material with a reduced amount of equipment, expertise and cost.

27 Claims, 3 Drawing Sheets

U.S. PATENT DOCUMENTS

| | | | |
|---|---|---|---|
| 3,832,602 | 8/1974 | Englehard et al. | 317/101 |
| 3,939,381 | 2/1976 | Meany | 317/101 |
| 3,971,661 | 7/1976 | Lindberg et al. | 96/36.2 |
| 4,023,999 | 5/1977 | Lindberg et al. | 156/652 |
| 4,030,190 | 6/1977 | Varker | 29/625 |
| 4,104,111 | 8/1978 | Mack | 156/656 |
| 4,179,800 | 12/1979 | Takaba et al. | 29/625 |
| 4,211,603 | 7/1980 | Reed | 156/659 |
| 4,217,182 | 8/1980 | Cross | 204/15 |
| 4,303,798 | 12/1981 | Paunovic | 174/68.5 |
| 4,305,975 | 12/1981 | Ikari et al. | 427/97 |
| 4,325,780 | 4/1982 | Schulz, Sr. | 156/659.1 |
| 4,327,167 | 4/1982 | Tanabe | 430/31 |
| 4,330,684 | 5/1982 | Hayward | 174/68.5 |
| 4,336,100 | 6/1982 | Passlick | 156/630 |
| 4,339,303 | 7/1982 | Frisch et al. | 156/629 |
| 4,424,095 | 1/1984 | Frisch et al. | 156/629 |
| 4,482,427 | 11/1984 | Hiraoka | 156/643 |
| 4,487,654 | 12/1984 | Coppin | 156/645 |
| 4,496,420 | 1/1985 | Frohlich et al. | 156/643 |
| 4,591,411 | 5/1986 | Reimann | 156/634 |
| 4,605,471 | 8/1986 | Mitchell | 156/645 |
| 4,608,274 | 8/1986 | Wooten | 427/96 |
| 4,610,756 | 9/1986 | Strobel | 156/645 |
| 4,642,161 | 2/1987 | Akahoshi et al. | 156/630 |
| 4,661,654 | 4/1987 | Strobel | 174/68.5 |
| 4,673,458 | 6/1987 | Ishikawa et al. | 156/659.1 |
| 4,689,111 | 8/1987 | Chan et al. | 156/643 |
| 4,714,516 | 12/1987 | Eichelberger et al. | 156/628 |
| 4,720,322 | 1/1988 | Tiffin | 156/643 |
| 4,720,324 | 1/1988 | Hayward | 156/645 |
| 4,756,795 | 7/1988 | Bakos et al. | 156/645 |
| 4,770,900 | 9/1988 | Seibel | 427/97 |
| 4,780,177 | 10/1988 | Wojnarowski et al. | 156/643 |
| 4,804,615 | 2/1989 | Larson et al. | 430/314 |
| 4,830,706 | 5/1989 | Horwath et al. | 156/643 |
| 4,871,418 | 10/1989 | Wittlinger et al. | 156/643 |
| 4,894,115 | 1/1990 | Eichelberger et al. | 156/643 |
| 4,959,119 | 9/1990 | Lantzer | 156/644 |
| 4,975,142 | 12/1990 | Iannacone et al. | 156/630 |
| 4,983,252 | 1/1991 | Masui et al. | 156/630 |
| 5,022,956 | 6/1991 | Cziep et al. | 156/643 |
| 5,022,960 | 6/1991 | Takeyama et al. | 156/643 |
| 5,066,360 | 11/1991 | Daley et al. | 156/660 |
| 5,088,008 | 2/1992 | Takeyama et al. | 361/403 |
| 5,112,462 | 5/1992 | Swisher | 205/165 |
| 5,137,791 | 8/1992 | Swisher | 428/612 |
| 5,148,265 | 9/1992 | Khandros et al. | 357/80 |
| 5,148,266 | 9/1992 | Khandros et al. | 357/80 |
| 5,158,645 | 10/1992 | Covert et al. | 156/645 |
| 5,194,713 | 3/1993 | Egitto et al. | 219/121.71 |
| 5,218,761 | 6/1993 | Maniwa et al. | 29/852 |
| 5,258,330 | 11/1993 | Khandros et al. | 437/209 |
| 5,282,312 | 2/1994 | DiStefano et al. | 29/830 |
| 5,284,548 | 2/1994 | Carey et al. | 156/630 |
| 5,288,541 | 2/1994 | Blackwell et al. | 428/209 |
| 5,364,707 | 11/1994 | Swisher | 428/612 |
| 5,378,314 | 1/1995 | Schmidt et al. | 156/544 |
| 5,436,062 | 7/1995 | Schimdt et al. | 428/209 |

FIG. 1
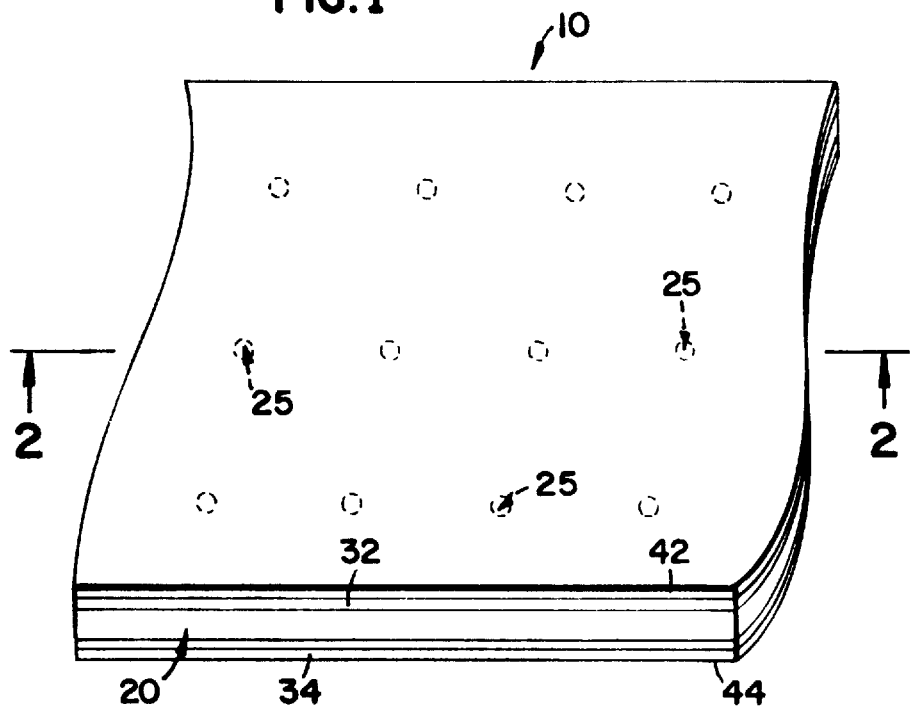
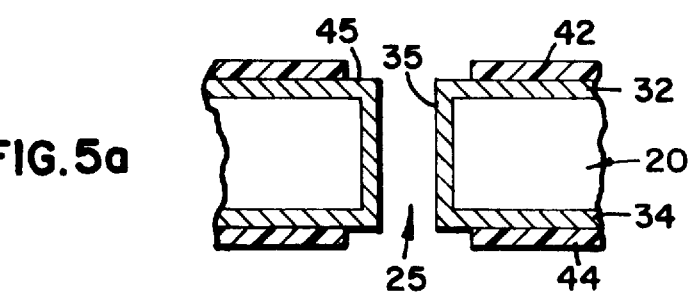
FIG. 5a
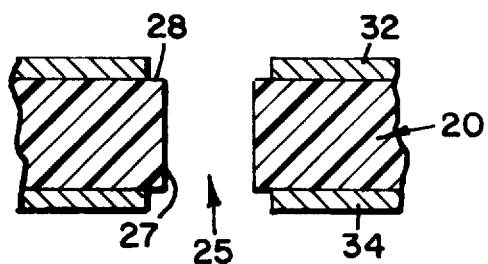
FIG. 5b

METALLIZED LAMINATE MATERIAL HAVING ORDERED DISTRIBUTION OF CONDUCTIVE THROUGH HOLES

FIELD OF THE INVENTION

The invention is directed to a metallized laminate material for use in printed circuit substrates and a method of manufacture therefor. More particularly, the invention is directed to a metallized laminate having an ordered distribution of conductive through holes or vias which is suitable for the production of high density printed circuit substrates such as multi-chip modules and the like and a method of manufacture therefor.

BACKGROUND OF THE INVENTION

New applications for computers, electronic controllers, and other digital electronics are continuously being developed. Digital electronics have also been integrated into many specialized applications which previously did not utilize such electronic control. Concurrent with the increase in digital electronics applications has been an increase in the need for printed circuit substrates such as printed wiring boards and the like for electrically interconnecting electronic devices together to form an electronic circuit.

The processing speed and information throughput of digital electronic devices has also increased substantially, placing additional burdens on the packaging density, speed and other electrical performance characteristics of printed wiring boards and the like. For instance, multi-chip modules (MCM's), which incorporate several unpackaged integrated circuits and other electronic devices directly mounted on a high density substrate, have become increasingly popular with electronics manufacturers, particularly in high performance applications.

However, a significant number of processing steps are required to produce a printed wiring board. For example, for a double-sided printed wiring board, opposing circuit layers must be formed on an insulating substrate, and further, a plurality of conductive through holes must be formed through the substrate for interconnecting the opposing circuit patterns.

In the manufacture of a typical double-sided printed wiring board, via holes are formed in an insulating substrate such as polyimide or polyester, and conductive material such as copper is deposited on both sides of the substrate and in each of the through holes. The through holes are either formed prior to the conductive material deposition step, or alternatively, may be formed after deposition, which typically requires further plating steps to deposit conductive material into the hole. The through holes are typically mechanically, laser or plasma drilled at various points on the substrate depending upon the particular interconnects required between circuit patterns.

Once the substrate material is metallized and the through holes are formed, a resist mask is typically applied to both sides of the substrate, typically either through a stencil or through a photoresist imaging process. Next, the conductive material on the opposing sides of the substrate is etched through the resist to form the final circuit pattern. Finally, the remaining resist material is removed, leaving the desired pattern of conductive material on both sides of the substrate.

The above-described process is commonly referred to as a subtractive process. Other processes such as additive or semi-additive deposition are also known in the art. For additive deposition, the layers of conductive material are deposited onto the substrate material through a resist mask, whereby no subsequent etching is required. In the semi-additive process, a thin seed layer is deposited over both sides of the substrate, additional material is plated onto the substrate through a resist mask, then the resist is removed and the entire board is etched to remove the exposed seed layer and form the final circuit pattern.

The above steps required for the formation of a printed circuit substrate are numerous, and many require the use of expensive and complex equipment. For instance, the metallization of a substrate material may require several individual steps, such as combinations of plasma treatment, sputtering, physical vapor deposition, chemical vapor deposition, electroplating, electroless deposition, ion plating, etc., each of which typically requires specialized equipment and knowledgeable operators. In addition, many of the above processes use chemical baths which must later be disposed with, often requiring specialized disposal procedures and the additional costs associated therewith.

All of the equipment and expertise necessary for printed wiring board manufacture may be prohibitively high for many manufacturers, particularly those requiring relatively small volumes and/or custom designs of printed wiring boards. However, given the cost and complexity of the equipment, many fabrication processes are best suited only for high volume production. It is generally not commercially practical for many manufacturers to produce small volume and/or custom printed wiring board designs in house. Consequently, many manufacturers contract out with one of a few suppliers to provide finished printed wiring boards. Prototype boards typically are also contracted out to suppliers. Many manufacturers, however, prefer to maximize the number of production processes in house to better control costs and turnaround times.

Stock laminate materials are available to enable manufacturers to produce finished printed wiring boards therefrom with a reduced amount of equipment and processing. Most stock laminate materials include a dielectric polymer film with layers of unpatterned conductive material laminated on one or both sides thereof. For producing single sided printed circuit boards, this material is particularly convenient in that a manufacturer needs only to deposit a resist mask, etch away the conductive material, and remove the remaining resist. Further, if the laminate is provided in roll form, the manufacturer may need to cut out the individual printed wiring boards from the roll material. All of these processes are comparatively uncomplicated and inexpensive, and do not require a great deal of expensive and/or specialized equipment.

However, to produce double-sided printed wiring board designs, a manufacturer may be required to form through holes at various points on the printed wiring board to interconnect the opposing circuit patterns. Drilling holes in a laminate material having conductive material already deposited on both sides thereof requires separate plating or metallizing operations after drilling the holes to deposit conductive material within each of the holes. Consequently, stock laminate materials are often not well suited for use in house for high performance, high density double-sided printed board designs since the circuit board manufacturer often must perform the additional steps of drilling and depositing additional conductive material to form the vias.

U.S. Pat. No. 4,770,900 to Seibel discloses laminates having a regular array of conductive vias electrically interconnecting opposing unpatterned conductive layers on the surfaces thereof. A manufacturer or other end user may use a Seibel laminate to produce a printed circuit board by stenciling resist on the conductive layers, then etching and/or plating (depending upon the deposition technique) the final circuit patterns thereon, and finally removing the stencil from the board. By providing a regular array of vias having the conductive material deposited therein, a manufacturer may design a printed circuit board which uses only a portion of the via holes, etching around the remainder of the via holes to electrically isolate them from other portions of the circuit. The advantage of this system is that only the stencil deposition, patterning (i.e., etching and/or plating), and stencil removal steps are required to be performed by a manufacturer. Consequently, a manufacturer may build small volume and/or custom printed wiring boards without a large amount of additional equipment and expertise.

Several drawbacks exist with the Seibel process. In particular, the processes disclosed in Seibel are not particularly suited for high performance/high density applications. First, relatively thick conductive layers such as copper foils are bonded to a substrate through adhesives, which are not as reliable as thinner and more advanced adhesivelessly deposited conductive layers. Also, the use of adhesives and conventional copper foils significantly reduces the packaging density obtainable on a printed circuit board due to patterning difficulties and etching undercut, both of which increase the required circuit trace pitch of a printed circuit board.

Furthermore, Seibel discloses the use of one millimeter vias (1000 microns) having 2.5 millimeter spacing therebetween. In many of today's more advanced applications such as MCM's, line widths and line spacing may be on the order of 100 microns or less, which is an order of magnitude smaller than the size of the Seibel vias. The addition of conductive pads around the large vias for interconnecting with circuit traces further increases the surface area occupied on the circuit board. Consequently, the Seibel vias would take up an inordinate amount of area on a printed circuit board and significantly affect the packaging density of the board. The vias would also significantly increase the difficulties in designing high density printed circuit boards since the traces in each pattern would need to be routed around many relatively large used and/or unused vias. Consequently, the Seibel process is not particularly suited for high density, high performance double-sided printed wiring board applications.

Therefore, a need exists for a laminate material suitable for use in the manufacture of high performance, high density double-sided printed wiring boards utilizing conductive through holes interconnections, which does not require a significant number of additional process steps, equipment, and/or expertise to form the finished printed wiring boards therefrom.

SUMMARY OF THE INVENTION

The invention addresses these and other problems associated with the prior art in providing a metallized laminate material having an ordered distribution of metallized through holes suitable for use in high performance, high density double-sided printed wiring board applications. The via holes preferably have diameters and land areas defined therearound which are consistent with the line widths and spacing of conductive traces patterned on the opposing surfaces of finished printed wiring boards. Furthermore, the via holes are preferably arranged in an ordered distribution having a pitch which provides an adequate number of through the board interconnections while retaining sufficient surface area for routing circuit traces between vias.

The preferred metallized laminate material is suitable for high volume production, thereby providing the associated cost savings therefrom. Further, the metallized laminate material is well suited for manufacturing small volume and/or custom designs of printed wiring boards as the material does not require a significant number of additional process steps, equipment, and/or expertise to form finished printed wiring boards therefrom.

Therefore, in accordance with one aspect of the invention, a metallized laminate material is provided including a dielectric polymeric film substrate including a plurality of vias arranged in an ordered distribution, each via having a diameter of less than or equal to about 200 microns and including a wall defining a through hole extending between the opposing surfaces of the substrate; a conductive material adhesivelessly deposited on the opposing sides of the substrate and on the via walls to define first and second conductive layers on the opposing sides of the substrate; and first and second photoresist layers deposited on the opposing sides of the substrate to substantially cover the conductive layers and the vias.

In accordance with a further aspect of the invention, a metallized laminate material is provided for use in the manufacture of a printed wiring board having a pitch defining a minimum spacing between centers of adjacent circuit traces on the manufactured board. The metallized laminate material includes a dielectric polymeric film substrate including a plurality of vias arranged in an ordered distribution having a pitch defining a minimum spacing between centers of adjacent vias, each via having a diameter which is between 10 and 50 percent of the pitch of the manufactured board; and a conductive material adhesivelessly deposited on the opposing sides of the substrate and on the via walls.

In accordance with an additional aspect of the invention, a metallized laminate material is provided including a dielectric polymeric film substrate including a plurality of vias arranged in an ordered distribution with a pitch that is less than or equal to about 2.1 mm, each via including a wall defining a through hole extending between the opposing surfaces of the substrate and having a diameter of less than or equal to about 125 microns; a conductive material adhesivelessly deposited on the opposing sides of the substrate and in each via and having a maximum thickness of less than or equal to about 35 microns; and first and second photoresist layers deposited on the opposing sides of the substrate with thicknesses of less than or equal to about 40 microns to substantially cover the conductive layers and the vias.

According to a further aspect of the invention, a method of manufacturing a metallized laminate material for use in the manufacture of printed wiring boards is provided including the steps of drilling a plurality of vias in a dielectric polymer film substrate, with the vias having diameters of less than or equal to about 200 microns and being arranged in an ordered distribution; and adhesivelessly depositing conductive material concurrently onto the opposing surfaces of the substrate and in each of the vias.

These and other advantages and features, which characterize the invention, are pointed out with particularity in the claims annexed hereto and forming a further part hereof. However, for a better understanding in the invention, and the advantages attained by its use, reference should be made to the accompanying descriptive matter, in which there is described a preferred embodiment of the invention.

BRIEF DESCRIPTION OF THE DRAWINGS

FIG. 1 is a partial fragmentary perspective view of a preferred metallized laminate material consistent with the invention.

FIG. 2 is a partial fragmentary cross-sectional view of the preferred metallized laminate material of FIG. 1, taken along line 2—2.

FIGS. 5A and 5B are enlarged partial fragmentary cross-sectional views of a metallized through hole before and after etching and resist removal, respectively.

DETAILED DESCRIPTION OF THE PREFERRED EMBODIMENT

Figure 3:
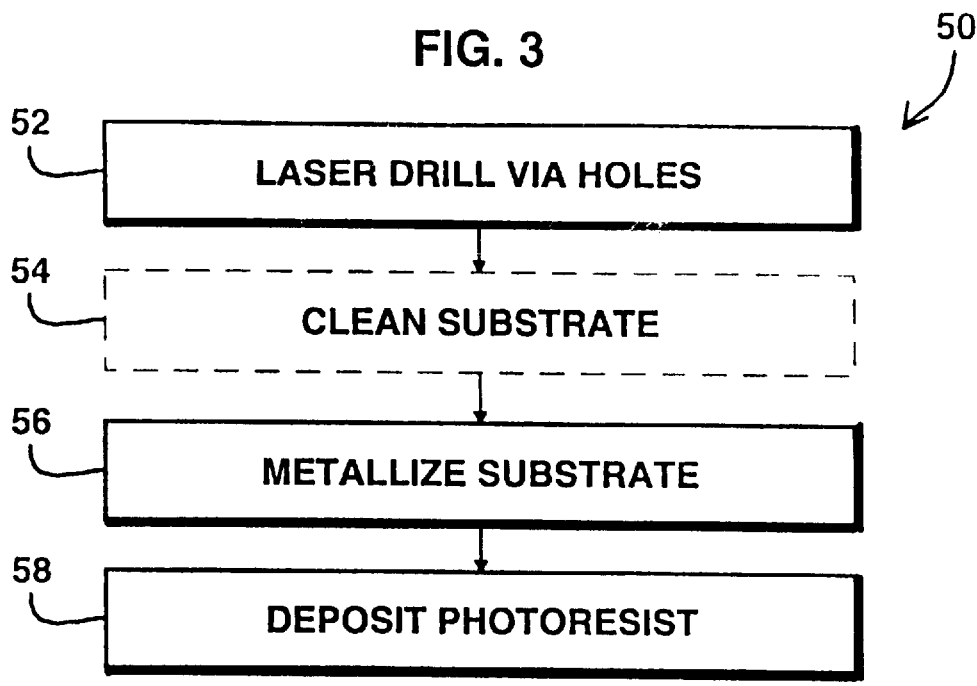
FIG. 3 is a flowchart of a preferred process for manufacturing the metallized laminate material of FIGS. 1 and 2.

Turning to the Drawing, wherein like numbers denote like parts throughout the several views, FIGS. 1 and 2 show a preferred metallized laminate 10 consistent with the invention. Laminate 10 includes a dielectric substrate 20 having a first side 22 and a second side 24 with an ordered distribution of vias 25 formed therein extending between the first and second sides. Conductive material 30 is preferably adhesivelessly deposited on substrate 20 to form first conductive layer 32 and second conductive layer 34 electrically interconnected by conductive barrels 35 deposited on vias 25. A photoresist 40 is deposited over conductive material 30 to form first photoresist layer 42 and second photoresist layer 44.

The preferred laminate 20 is provided to customers in roll form with unetched conductive layers 32 and 34 in electrical contact with substantially all of vias 25, and with photoresist layers 42 and 44 substantially covering the surface area of both conductive layers. The vias are preferably arranged in an ordered distribution to enable a customer (or "end user") to manufacture custom high performance, high density double-sided printed wiring boards with only a few relatively simple and inexpensive steps, including, but not limited to, imaging the photoresist and removing the excess thereof, etching the conductive material to form the desired circuit patterns and through hole interconnections, removing the remainder of the photoresist, and excising the finished circuit from the roll material.

While many of the advantages and features of the invention will be described with reference to the potential cost and manufacturing benefits for end users which are "customers" that purchase the preferred metallized laminate materials and form customized printed circuit or wiring boards therefrom, it will be appreciated that the principles of the invention will apply to other manufacturers and producers of printed wiring boards and the like. In particular, the end user of a preferred laminate material may be the initial producer of that material.

Manufacture of Metallized Laminate Materials

FIG. 3 is a flowchart of a preferred process 50 for manufacturing metallized laminate materials consistent with the invention. In the preferred process, the first step 52 is to drill an ordered distribution of via holes in a roll of dielectric substrate material, preferably by a laser ablation or plasma drilling process. Next, in step 56, the substrate is metallized to form conductive material on the opposing surfaces and in the vias thereof. Next, in step 58, layers of photoresist are then deposited on the opposing surfaces of the substrate substantially covering the opposing conductive layers and vias. An optional substrate cleaning step 54 may also be used prior to metallization to clean off any surface contamination formed on the substrate by the drilling process.

A number of dielectric materials may be used as a substrate in the preferred metallized laminates. Preferably, a dielectric material such as a polymeric film is used as the substrate. Polyimide is the most preferred substrate for use with the invention, however, other dielectric materials such as addition polymers, condensation polymers, natural polymers, treated films, or thermosetting or thermoplastic resins may be used in the alternative. Specifically, such substrate materials as polyester, polyethylene naphthalate, polyethylene terephthalate, fluorinated poly(ethylene-propylene) [FEP], poly(ethylene-co-terephthalate), polyvinyl fluoride (PVF), and aramid paper may be used. Rigid substrate materials, such as ceramics or rigid glass epoxy constructions may also be used with the metallized through hole process, however, these rigid materials tend to be more expensive, and do not have the flexibility or thinness to which many of the advantages of the preferred process provides. In addition, these latter materials are not well suited to roll-to-roll production, and consequently, would have more complex handling requirements.

Substrate dielectric materials in thicknesses between about 12 and 125 microns are preferred. In particular, polyimide films are commonly available in thicknesses of 25 and 50 microns, among others. The substrates are preferably provided in a roll format, whereby they may be conveyed through the different manufacturing processes by roll-to-roll manipulation. This type of processing is relatively fast, efficient and inexpensive as compared with other manners of conveying material. It will be appreciated, however, that the substrates may be provided in sheets in the alternative, and handled during manufacture accordingly.

Via Formation

In order to manufacture the preferred metallized laminate, the first step (shown as step 52 in FIG. 3) is to drill, or form, a number of vias, or through hole apertures, in a blank dielectric substrate material. The preferred process for forming the through holes is laser ablation, whereby a high energy laser beam is directed onto the surface of the substrate to etch holes in the surfaces thereof. Different laser ablation processes are known in the art.

Laser drilling or ablation is readily suited for high volume production operations as it may be performed in a roll-to-roll process, and further, it can scan a large number of vias in a relatively short period of time. In addition, laser ablation can provide extremely small through holes, as low as 25 microns in diameter or less.

In many laser ablation processes, a high energy ultraviolet laser beam is directed onto a substrate to decompose the substrate material and "drill" an aperture into the substrate. An optical system is used to convey the beam to the substrate surface, and the optical system is controllable to move the beam to a plurality of positions to scan a plurality of apertures in the substrate according to a desired, predefined pattern. In many processes, the laser is pulsed to provide more controllable ablation and to reduce the amount of surface soot contamination deposited around each aperture. Furthermore, the laser ablation may be performed in a controlled atmosphere of an inert gas to reduce oxidation and/or reaction between the ambient atmosphere and the substrate material, which often reduces the amount of soot deposited on the substrate.

An alternative process for drilling the vias in the substrate is plasma drilling. This technology is available, for example, from Dyconex Engineering Gmbh of Schönaich, Germany, among others. In a typical plasma drilling process, a base dielectric film has at least a seed layer of copper or another conductive material deposited over both sides thereof. The resulting laminate is etched through a photoresist mask to form the desired ordered distribution of openings in the copper layers, thereby exposing the base dielectric material underneath. After the resist mask is removed, the laminate is etched in a plasma chamber. The surfaces of the laminate covered by the copper layers will not be etched by the plasma; however, the exposed areas of base dielectric will be etched away by the plasma to form the ordered distribution of apertures in the laminate. It is believed that the plasma drilling process may be capable of producing vias which are as small as the laser ablation process (as low as 25 microns or less).

Laser ablation and plasma drilling processes are both preferred because they can provide small vias in a fast and efficient manner. In addition, both processes offer high precision, with registration and via diameter being controllable to within only a few microns of error. It is believed that circular or elliptical vias having maximum diameters of less than about 200 microns, preferably less than about 125 microns, more preferably less than about 35 microns, and most preferably about 25 microns, can be formed using either process. Furthermore, aspect ratios of about 1:1 to 1:2, and preferably about 1:1 to 1:1.4, may be obtained with either process.

A separate cleaning step (shown as optional step 54 in FIG. 3) may be required to clean off soot or other contamination formed around the vias during the drilling process, particularly for laser ablation processes. It has been found that the adhesion of conductive material to the substrate may be degraded if much contamination is left around the vias since conductive material does not wet particularly well to the contamination. Examples of cleaning processes include reflowing the soot debris material, applying ultrasonic energy to the substrate, immersing the substrate in an etchant, plasma cleaning or etching the substrate, vapor honing or blasting the substrate, etc.

Other processes for forming apertures or holes in a substrate may also be used, such as stamping, punching, drilling, etc. However, the practical limits of many of these technologies is about 100 micron diameter holes under carefully controlled conditions and only at low volumes. At higher volumes (e.g., as would be required for a high density ordered distribution of holes), many of these processes are limited to holes of 300 micron diameters or more.

Figure 6:
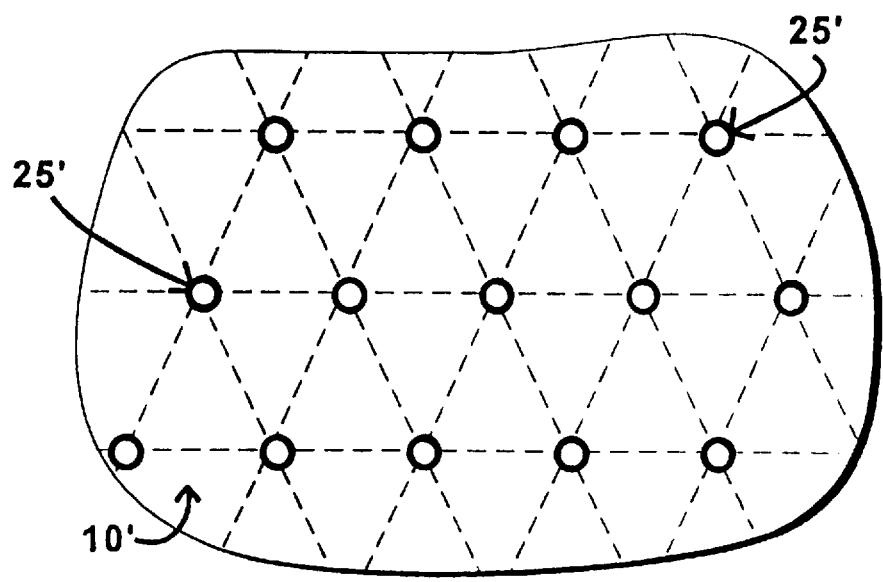
FIG. 6 is a partial fragmentary top plan view of an alternate ordered distribution arrangement of through holes on a metallized laminate, with the top photoresist layer not shown for ease of illustration.

For the preferred laminates, the vias are arranged in ordered distributions with a pitch (the distance between the centers of adjacent vias) of between about 0.25 and 2.1 millimeters(mm) (about 10 to 80 mils), preferably between about 0.5 and 1.3 mm (about 20 to 50 mils). By an "ordered distribution", we mean an arrangement of vias which whereby the vias are spatially oriented relative to one another in a defined geometric and periodic pattern or grid on the substrate. The vias may be arranged in many different patterns, such as square, rectangular, diamond, or triangular, to name a few, and may be formed over only a portion of a substrate, or alternatively, may be formed over substantially all of a substrate. The laminate 10 shown in FIG. 1 exemplifies a square pattern distribution of vias, whereby the vias are arranged in a plurality of parallel rows and parallel columns, with each row being orthogonal to each column. This arrangement is preferred because it is compatible with simple double-sided structures such as intermeshed power planes, for example. An alternate ordered distribution of vias on a laminate material 10' is shown in FIG. 6, where the vias 25' are arranged in a plurality of rows with alternate rows of vias offset half the distance between vias in adjacent rows, producing a generally triangular pattern.

The ordered distribution of vias is preferably formed substantially throughout a working area of the substrate. This working area may occupy all of the surface area of a substrate, or only a portion thereof. For example, the working area may exclude strips of material along the edges thereof which assist in handling the material or which are typically removed from the finished product. In addition, the working areas for adjacent portions along a roll of substrate material may border one another to provide a continuous ordered distribution of vias along the roll.

Metallization

Once the apertures (vias) are formed on the substrate, conductive material is preferably formed on all exposed surfaces of the substrate by an evaporative through hole metallization process (shown as step 56 in FIG. 3). This process is the subject of U.S. Pat. Nos. 5,112,462 and 5,137,791 to Swisher. To the extent necessary to support this disclosure, the disclosure of these references is incorporated by reference herein.

In accordance with the Swisher process, the substrate bearing the ordered distribution of through holes, or vias, is first subjected to plasma treatment in a plasma chamber to condition the substrate for the deposition of conductive material on its surfaces. In the plasma chamber, the surfaces of the substrate material are conditioned by forming thin, random, and preferably non-continuous distributions of metal oxide on the surfaces of the substrate. A cathode is included in the plasma chamber which is preferably constructed of a material such as chromium, titanium, iron, nickel, molybdenum, manganese, zirconium, or mixtures thereof, so that oxides of one or more of the above materials may be generated in the plasma chamber and deposited on the surfaces of the substrate. This process enables conductive layers to be bonded to the substrate material in such a fashion that peel strengths in excess of 2 pounds per inch, and even in excess of 10 pounds per inch, may be obtained without the use of adhesives.

The substrate, thus treated, is next subjected to a vacuum deposition (evaporative) process in order to form thin layers of conductive material on one or both surfaces and in the through holes of the substrate. Copper is a preferred conductive material, as it is relatively inexpensive and easy to work with. Alternative conductive materials include aluminum, gold, silver, or other known conductive materials.

The vapor metallization (vacuum deposition) process is a known low pressure/high temperature process, where copper or another metal is vaporized at low pressure and high temperature and then deposited upon the surface of the substrate material. In the preferred embodiment, copper is deposited on the treated surfaces and through hole apertures (vias) of the substrate to a thickness of about 50–500 nanometers, most preferably about 200 nanometers. It has been found that this thickness of copper forms a strong base for securely joining later copper layers to the substrate material.

Alternative to vacuum deposition of a first layer of copper, a chemical deposition process, known in the art, may instead be used to bond copper to the treated surfaces of the substrate.

Another alternative step which may be performed in lieu of vacuum deposition is the use of a sputtering process to transfer conductive material onto the treated surfaces and through holes of the substrate. In the sputtering process, ions are accelerated against a cathode in low pressure by generating a high electrical potential in a chamber. This causes the cathode material, in this case copper, to be excited and transferred to the substrate material which is oriented so as to receive the sputtered copper.

One advantage of the use of the vacuum deposition in the through hole metallization process is that the plasma treatment and the vacuum deposition may take place in separate zones of the same vacuum chamber. This generally results in higher reliability and lower reject rates due to the reduced handling which is associated by combining these steps into the same chamber. However, one skilled in the art will appreciate that successive individual steps may also be used in the alternative.

Once a 50–500 nanometer thin conductive layer is formed on each side and in the through holes (vias) of the substrate material, the desired thickness of copper material is preferably formed by an electroplating process that is known in the art. Generally, electroplating involves placing a substrate material in solution supplied with electrical power, and with the substrate material configured as a cathode. The desired conductive material, in this case copper, is present in the solution and is deposited on the substrate by this process. Electroplating is a well known process which provides high reliability and controllability, and it is this process which is used to produce the final desired thickness of conductive material 30 in each side of substrate material 20.

Instead of electroplating, the final thickness of conductive material may be formed by an electroless process which is also generally known in the art. Vacuum deposited thicknesses in excess of the 50–500 nm conductive layer (even as thick as 2 or 3 microns) are also possible. Other methods of depositing conductive material onto a substrate may also be used.

By virtue of the above process steps, conductive layers 32 and 34 are formed on both sides of dielectric substrate 20, and an ordered distribution of metallized through holes (each comprising a via or aperture 25 having a barrel of conductive material 35 formed on the walls thereof) to electrically interconnect layers 32 and 34. While the conductive layers preferably substantially cover both sides of the substrate, it will be appreciated that the conductive layers may only be deposited at selected portions of the substrate, thereby leaving some undeposited areas on the substrate.

The conductive layers and metallized through holes may be constructed to have finished thicknesses of at most about 35 microns, more preferably a finished thickness of at most about 12.5 microns, and most preferably a finished thickness of at most about 5 microns. Other thicknesses may be desirable based upon such considerations as current carrying capacity.

Preferably, the metallized through holes and conductive layers will have the same thickness since they are preferably formed simultaneously by the through hole metallization process. However, one skilled in the art will appreciate that the through holes and conductive layers may be deposited partially or completely independently from one another to varying thicknesses.

Other techniques, or combinations of techniques, may be utilized to produce relatively thin yet durable laminates. Any combination of vacuum deposition, chemical deposition, sputtering, plating, and/or other deposition techniques may be used consistent with the invention. Also, other processes for treating a substrate to increase its adhesion properties, including various oxidizing techniques, may also be used consistent with the invention. While adhesive-based lamination processes may be used to deposit conductive material onto the substrate, "adhesiveless" processes (i.e., processes which do not rely on conventional adhesives, e.g., epoxies or other polymers, to bond conductive layers to a substrate) are generally preferred given the performance advantages attained therefrom.

The above-described metallization process is a subtractive process, i.e., a full layer of conductive material is deposited on the substrate, and is later etched to form the finished circuit patterns. It is believed that additive or semi-additive processes may be incorporated in some applications; however, these processes would require additional steps to be performed by the end users manufacturing the finished circuit board designs. For example, for a semi-additive process, a thin seed layer of conductive material of about 0.1 to 5 microns may be applied to form the conductive layers. Later, an end user would image the photoresist to form a negative image resist mask, plate through the mask to form thicker conductive traces and metallized through holes, remove the remaining resist, and etch the conductive layers to remove the unplated seed layers.

Using the above-described metallized through hole process, a number of benefits are obtained over prior laminate construction methods. Many of these prior processes typically rely on adhesives to bond conductive layers to a substrate; however, the adhesiveless through hole metallization process eliminates the need for adhesives. In many prior systems, base layers of 18 microns of copper or more are typically bonded to a substrate material using 17 microns of adhesive material. In addition, to form through holes with these prior adhesive-based systems, the through holes generally are formed and plated after the base layers of copper are layered onto the substrate. Generally, an additional 25 microns of copper (or as low as 15 microns in some advanced constructions) are plated onto the through holes in order to form electrical interconnections between the opposing sides of the substrate. Consequently, each conductive layer formed on a substrate using these prior adhesive-based systems adds at best about 50–60 microns in thickness.

However, the above-described adhesiveless process is capable of providing reliable, delamination resistant conductive layers and metallized through holes at a thickness of about 5 microns or less. This offers a significant advantage over prior adhesive-based, as well as cast film adhesiveless laminates in the art due to the increased reliability, flexibility, packaging density, and environmental characteristics which are typically associated with thinner constructions.

The elimination of adhesive in the adhesiveless through hole metallization process provides a number of benefits over prior adhesive-based processes. In general, laminates fabricated by the through hole metallization process are more resistant to thermal stresses than prior adhesive-based methods, since the adhesives used in these prior methods is generally susceptible to breakdown from elevated temperatures or repeated cycling. When using a temperature resistant substrate material, however, the adhesiveless through hole metallization process is capable of providing excellent thermal resistance, particularly during post-processing assembly and in operating environments subjected to high temperatures and/or repeated cycling.

Another benefit of the above-described process is a greater chemical stability than is found in prior methods. It has been found that the adhesives used in many prior adhesive-based methods is somewhat susceptible to breakdown from exposure to harsh chemicals, and consequently, the elimination of this adhesive in the adhesiveless process described above allows a wider variety of processing chemicals to be used in post-processing assembly steps and also allows laminates to be used in environments where chemical exposure may be likely.

Stronger through holes are also provided by the above-described process, in part due to the elimination of adhesive which generally degrades the performance of through holes from repeated stresses. Such stresses typically arise from thermal cycling of the circuit during component assembly or during normal operation in extreme operating environments. It has been found that assemblies constructed with the preferred process can provide 5 micron-thick through holes that are able to withstand 35 kg/cm$^2$ of pressure at 180° C. without any barrel deformation or cracking present. This was not previously possible with an adhesive-based construction.

Other advantages are provided by the preferred process over prior methods due to the relatively lesser thicknesses of conductive layers (i.e., about 5 microns in the preferred constructions versus 50–60 microns in prior adhesive-based assemblies). One advantage is a greater packaging density which may be obtained, which is particularly important for advanced high performance/high density applications. This is provided in part based upon the fact that, with the through hole metallization process, the finished copper layer is the same thickness as copper deposited in the through holes. Since more copper is generally plated onto the conductive layers of an adhesive-based process than the through holes, additional copper must be plated around the through holes so that the through holes will survive the later etching processes. Consequently, thicker layers of copper will remain on the surfaces of the substrate when suitable through holes have been constructed. Another key to the increase in packaging density with the preferred process is the fact that etching undercut is minimized by the reduction of surface copper thickness. In prior methods, the etchant material tended to etch horizontally to a greater degree because of thicker coppers, requiring wider conductive traces in order to survive the etching process. In the preferred process the ability to obtain thinner copper on the surface minimizes etching undercut, and consequently a smaller line resolution may be utilized. Thinner copper also means the valley depth between etched conductors is less, hence the penetration and etching action of chemicals in the valleys may be more evenly controlled, also providing finer resolution. In fact, using the preferred process, the limits on line resolution are no longer dependent upon the thickness of the copper layer on the substrate, but are limited instead by the resolution capability of the photoresist material.

Furthermore, specifically with regard to providing a stock laminate material which can be used by end users to produce custom printed wiring boards, the above-described evaporative metallized through hole process provides another benefit over other adhesive-based, as well as some adhesiveless processes in that the evaporative metallized through hole process is readily suitable for high volume and/or low cost production. The number of steps and materials, as well as the time to perform each of the steps, in the metallized through hole process is generally less than many prior methods. Further, the preferred process is also characterized as a "dry" method, which is more environmentally friendly than many other techniques. Consequently, the metallized through hole process may be utilized in a wider variety of applications, with reduced economic restraints compared to many prior technologies.

Another important benefit of the thinner copper layers produced by the preferred process is the increased flexibility and reliability of the finished laminates over prior, thicker assemblies. The ability of a flexible substrate to withstand repeated and/or narrowed radius bends and resist delamination is important in many applications, most notably dynamic flex applications such as disk drive read/write heads, printer heads, and display interconnects for portable, laptop, notebook and subnotebook computers. In general, the thinner a laminate, the more flexible it is, and the less it is subjected to tension or compression forces produced by bending. Consequently, the thinner layers provided by the preferred process offer a significant advantage over the significantly thicker prior assemblies which must conform to the conventional thickness limitations.

Flexibility and reliability are also benefited by the adhesiveless through hole metallization process beyond its thinner conductive layers. It has been found that the surface of the conductive material which is bonded to the substrate by the preferred process has a desirable surface profile which aids in flexibility and in maintaining a more reliable delamination resistant connection with the substrate. This is important because it has been found that one important factor in determining flexibility and reliability of a conductive layer is the surface profile of the conductive material joined to a substrate material.

Photoresist Deposition

Once layers of conductive material 30 have been formed on the dielectric substrate, photoresist layers 42 and 44 are deposited thereon by a photoresist deposition process (shown as step 58 in FIG. 3). The photoresist layers 42 and 44 preferably cover substantially all of conductive layers 32 and 34, and preferably cover the walls of each of the vias 25. As shown in FIG. 2, the vias may also be completely filled with photoresist, particularly in smaller vias having diameters in the range of 25 microns or less. However, for larger vias, only the walls of the vias may be covered with photoresist, leaving exposed apertures extending through the vias. In addition, if dried or cured films of photoresist are used, the apertures in the vias themselves may be covered coextensive with the conductive layers without any photoresist deposited directly on the walls of the vias.

The photoresist is preferably an epoxy based photoresist deposited by electrophoresis to a thickness of between 2 and 40 microns, preferably between 8 and 12 microns, most preferably about 10 microns. The photoresist may be a positive or negative imagable material, the use of which is known in the art. Other materials and methods of deposition therefor may also be used. However, the preferred material is readily suitable for deposition, transportation and storage on a roll of metallized laminate material, which is particularly important for providing a stock laminate for custom printed wiring board designs.

While the preferred photoresist material is preferably deposited by the manufacturer of the metallized laminate material, it is also possible that the metallized laminate material is sold without the photoresist layers deposited thereon, whereby the photoresist could be deposited by the end user. In addition, a non-photoimagable resist could be stencilled onto the conductive surfaces by an end user. However, this would require additional equipment and processing steps for the end user. Furthermore, with stenciling, it is typically not possible to obtain the line widths/spacing required for high performance/high density applications. The practical limits on stencilling are about 100 micron resolution, which is well above that required for high density applications which may require resolutions as low as 25 microns or less.

Therefore, by the aforementioned process, a metallized laminate material 10 is produced as a stock material for use by end users for specialized custom printed wiring board designs. Given the reliability and resolution obtained by the above processing steps, the process is particularly well suited for providing high performance and high density laminates in a high volume and a comparatively low cost manner.

Utilization of Metallized Laminate Materials

The preferred metallized laminate material may be provided to end users as a stock material in roll form. The end user may then produce customized printed wiring boards and the like therefrom using a few comparatively less complex and expensive operations.

Figure 4:
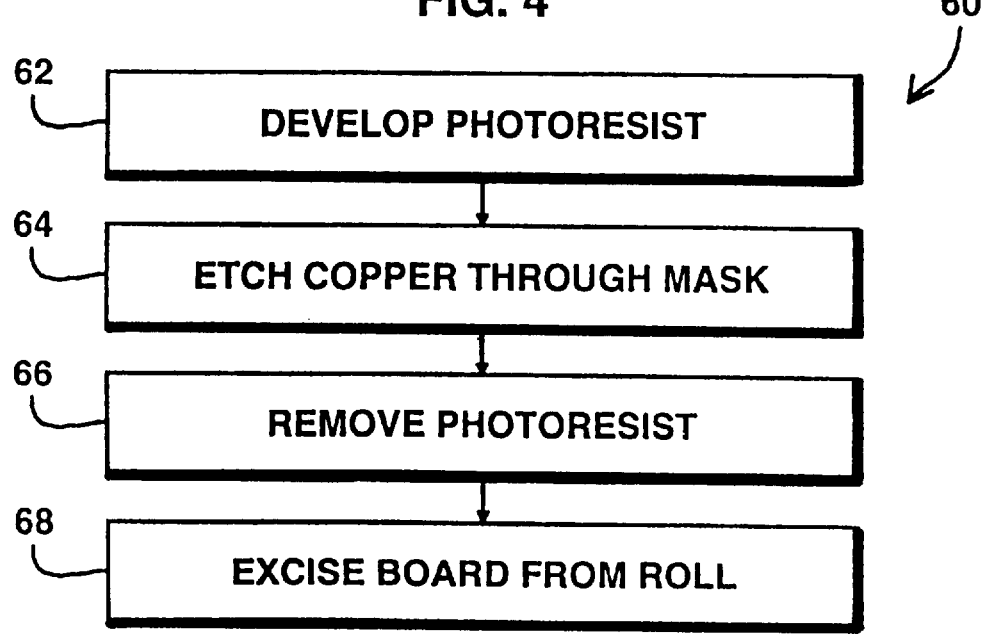
FIG. 4 is a flowchart of a preferred process for manufacturing finished printed wiring boards from the metallized laminate material of FIGS. 1 and 2.

FIG. 4 shows the steps in one preferred process 60 for manufacturing a printed wiring board using the subtractive method for a laminate material with 5 microns or more of copper deposited on each surface and in each via. The first step 62 in the process is to develop the photoresist to form a resist mask therefrom. Next, in step 64, the conductive layers and via holes are etched through the resist mask to form the desired circuit patterns and via interconnections. Next, the remaining photoresist forming the resist mask is removed in step 66, and the printed wiring board is excised from the roll of substrate material in step 68.

Imagewise development of a photoresist is known in the art. An opaque imaging mask is produced with transparent portions corresponding to the desired circuit patterns to be formed. After production of the imaging mask, the photoresist on the laminate material is exposed to high intensity ultraviolet light through the mask. The imaged photoresist is then exposed to a solvent such as an acid or alkaline aqueous solution to dissolve away the desired areas of the photoresist to form a resist mask therefrom.

Once the resist masks are formed in the photoresist layers, the exposed conductive material in the conductive layers and the vias is etched in step 64. Etching typically takes place in a bath of an etchant such as cupric chloride in a manner known in the art.

After etching, the remaining photoresist in the resist masks is removed in step 66 by exposure to a solvent such as an acid or alkaline aqueous solution. Once the photoresist material is removed, the conductive material remaining on the substrate forms the desired circuit patterns and interconnecting vias for the specific printed wiring board design.

It will be appreciated that the above steps are preferably performed in a roll-to-roll operation, which offers efficient and cost-effective handling of the workpieces through the manufacturing process. Therefore, for processes utilizing roll-to-roll article handling, as in step 68 of the preferred process, the finished printed wiring board is excised from the roll material using a standard stamping, punching, or cutting operation.

The finished printed wiring boards may be used in a wide variety of applications. Consequently, various additional steps may be incorporated in the preferred process for manufacturing finished printed wiring boards. For example, insulating coverlayers or insulation may be deposited on the outer surfaces of the boards. In addition, integrated circuit chips or other electronic components may be bonded directly to the boards in known manners. The boards may also be suitable for use in multilayer (three or more stacked conductive layer) assemblies, being bonded through anisotropic conductive adhesive layers. Many other conventional post processing steps may also be performed.

The above-described finishing process is typical of many subtractive manufacturing techniques. It will be appreciated that similar process steps, modified as described above, would be performed for manufacturing finished boards using semi-additive deposition.

Printed wiring boards may be produced from the preferred metallized laminate materials of the invention having higher performance and higher packaging density than many prior constructions. In particular, extremely fine and robust circuit traces and metallized vias may be manufactured using the preferred laminates. As discussed above, the preferred evaporative through hole metallization process provides adhesiveless interconnections between the conductive material and the substrate offering comparatively thinner constructions with higher packaging densities, while being extremely durable, delamination resistant, and environmentally sturdy.

Narrowly spaced circuit traces may be provided having line spacings and widths of less than or equal to about 100 microns, preferably as low as about 25 to 50 microns or less, most preferably about 50 microns (i.e., a pitch of less than or equal to about 200 microns, preferably as low as about 50 to 100 microns or less, most preferably about 100 microns). Vias as small as 25 microns may also be formed in the preferred laminates with pitches between about 0.25 and 2.1 mm, preferably between about 0.5 and 1.3 mm. It is believed that suitable land areas around each via (i.e., for interconnecting with circuit traces) may be constructed in the range of 125 microns or less. Therefore, vias and their associated land areas may occupy similar widths as the circuit traces, thereby simplifying the design of circuit patterns therefrom since the vias do not present comparatively large obstacles to route circuit traces around.

The vias are preferably sized with diameters that are between 10 and 50 percent of the pitch of the conductive traces to be formed on the finished printed circuit board, preferably about 25 percent. Furthermore, the pitch of the ordered distribution of vias (i.e., the minimum distance between via centers), should be selected such that the diameters of the vias represent between 1 and 25 percent of the ordered distribution pitch, preferably about 5 percent. This preferred range provides a sufficient number of via interconnects for most double-sided printed wiring board applications, while retaining sufficient spacing between vias to facilitate routing of circuit traces therebetween.

FIGS. 5a and 5b show the preferred manner of electrically isolating unused vias from the finished printed circuit patterns. As shown in FIG. 5a, apertures, such as aperture 45 in layer 42, are preferably formed in the resist masks comprising photoresist layers 42 and 44. These apertures preferably expose at least the conductive material 35 on the walls of via 25 through the mask, although small areas on conductive layers 32 and 34 circumscribing via 25 may also be exposed. As shown in FIG. 5b, after etching and removing the resist masks, the conductive material on the walls of via 25 is removed, leaving exposed dielectric material 27 which electrically isolates the opposing conductive layers through the via. It will be appreciated that with the preferred process the unused vias occupy a minimum amount of space on the board since the "breaks" in the electrical connections between conductive layers occur on the walls of the vias, rather than on the conductive layers themselves. Furthermore, even if circumscribing portions of the conductive layers are etched along with the via walls, e.g. portion 28, the occupied area is still substantially lesser than conventional processes.

It is believed that for many high performance, high density applications, etching the walls of the vias is advantageous in that any conductive material left on the via walls of unused vias could pose potential interference or impedance problems. However, in certain applications, it may be advantageous to leave conductive material on the walls of vias not connected to circuit patterns, for example, to provide thermal vias for heat dissipation.

Therefore, it will be appreciated that the invention provides a metallized laminate material and a method of manufacture therefor which offer significant advantages over conventional technologies in the manufacture of high performance, high density printed wiring boards and the like. One skilled in the art will appreciate that various changes and modifications may be made to the preferred embodiments without departing from the spirit and scope of the invention. Thus, the invention resides in the claims hereinafter appended.

We claim:

1. A metallized laminate material for use in the manufacture of a printed wiring board having a pitch defining a minimum spacing between centers of adjacent circuit traces on the manufactured board, the metallized laminate material comprising:

(a) a dielectric polymeric film substrate, the substrate having a working area on opposing first and second sides and including a plurality of vias arranged in an ordered distribution throughout the working area on the first and second sides and having a pitch defining a minimum spacing between centers of adjacent vias, and wherein each via has a diameter which is between 10 and 50 percent of the pitch of the manufactured board, and each via includes a wall defining a through hole extending between the opposing first and second sides of the substrate; and (b) an electrically conductive material adhesivelessly deposited on the opposing first and second sides of the substrate and on the via walls.

2. The metallized laminate material of claim 1, wherein each via has a diameter which is about 25 percent of the pitch of the manufactured board, and wherein the manufactured board has a pitch of less than or equal to about 200 microns.

3. The metallized laminate material of claim 1, wherein each via has a diameter which is between 1 and 25 percent of the pitch of the ordered distribution.

4. The metallized laminate material of claim 3, wherein each via has a diameter which is about 5 percent of the pitch of the ordered distribution.

5. The metallized laminate material of claim 1, wherein the conductive material in the vias and on portions of the opposing first and second sides of the substrate circumscribing and immediately proximate the vias has a maximum thickness less than or equal to the thickness of the conductive material throughout the remainder of the opposing first and second sides of the substrate.

6. The metallized laminate material of claim 1, wherein the substrate comprises a flexible polyimide film having a thickness of less than or equal to about 50 microns and having a coefficient of thermal expansion equal to that of the conductive material.

7. The metallized laminate material of claim 1, wherein each via has a diameter of less than or equal to about 35 microns.

8. The metallized laminate material of claim 1, wherein centers of adjacent vias are spatially separated by a distance less than or equal to about 2.1 mm.

9. The metallized laminate material of claim 1, wherein the vias in the ordered distribution are arranged in a plurality of parallel rows and parallel columns, each row being orthogonal to each column.

10. The metallized laminate material of claim 1, wherein the vias in the ordered distribution are arranged in a plurality of parallel rows with alternate rows of vias offset half the distance between vias in adjacent rows.

11. The metallized laminate material of claim 1, wherein the conductive material in the vias and on the opposing first and second sides of the substrate is adhered to the substrate through a layer of non-continuous random distributions of metal-oxide selected from the group consisting of oxides of iron, chromium, nickel, molybdenum, manganese, zirconium or mixtures thereof.

12. The metallized laminate material of claim 11, wherein the conductive material in the vias and on the opposing first and second sides of the substrate comprises a first metal layer, formed on the random distributions by vapor metallization, having a thickness of about 50 to 500 nanometers, and a second metal layer electroplated on the first metal layer, wherein the first and second metal layers have a thickness of less than or equal to about 35 microns and cover the opposing first and second sides of the substrate.

13. The metallized laminate material of claim 12, wherein the conductive material in the vias and on the opposing first and second sides of the substrate has a thickness of less than or equal to about 5 microns.

14. A metallized laminate material comprising:

(a) a dielectric polymeric film substrate, the substrate having a working area on opposing first and second surfaces and including a plurality of vias arranged in an ordered distribution throughout the working area on the first and second surfaces, with each via including a wall defining a through hole extending between the opposing surfaces of the substrate, wherein each via has a diameter of less than or equal to about 125 microns and the pitch of the vias arranged in the ordered distribution is less than or equal to about 2.1 mm;

(b) an electrically conductive material adhesivelessly deposited on the opposing surfaces of the substrate and in each via, the conductive material having a maximum thickness of less than or equal to about 35 microns; and (c) first and second photoresist layers deposited on the opposing surfaces of the substrate, wherein the photoresist layers cover the conductive layers and the vias and have thicknesses of less than or equal to about 40 microns.

15. The metallized laminate material of claim 14, wherein the substrate comprises a flexible polyimide film having a coefficient of thermal expansion equal to that of the conductive material.

16. The metallized laminate material of claim 15, wherein the substrate has a thickness of less than or equal to about 50 microns.

17. The metallized laminate material of claim 14, wherein each via has a diameter of less than or equal to about 25 microns.

18. The metallized laminate material of claim 14, wherein the pitch of the ordered distribution is between about 0.5 and 1.3 mm.

19. The metallized laminate material of claim 14, wherein each via has a diameter which is selected to be between about 10 and 50 percent of a pitch of circuit traces to be patterned on a printed wiring board manufactured from the metallized laminate material, wherein the pitch defines a minimum spacing between centers of adjacent circuit traces on the printed wiring board, and wherein the pitch of the circuit traces is less than or equal to about 200 microns.

20. The metallized laminate material of claim 14, wherein each via has a diameter which is between about 1 and 25 percent of the pitch of the ordered distribution.

21. The metallized laminate material of claim 14, wherein the conductive material in the vias and on the opposing surfaces of the substrate is adhered to the substrate through a layer of non-continuous random distributions of metal-oxide selected from the group consisting of oxides of iron, chromium, nickel, molybdenum, manganese, zirconium or mixtures thereof.

22. The metallized laminate material of claim 21, wherein the conductive material in the vias and on the opposing surfaces of the substrate comprises a first metal layer, formed on the random distributions by vapor metallization, having a thickness of about 50 to 500 nanometers, and a second metal layer electroplated on the first metal layer, wherein the thickness of the first and second metal layers is less than or equal to about 5 microns, and wherein conductive material covers the opposing surfaces of the substrate.

23. The metallized laminate material of claim 14, wherein the conductive material in the vias and on portions of the opposing surfaces of the substrate circumscribing and immediately proximate the vias has a maximum thickness lesser than or equal to the thickness of the conductive material throughout the remainder of the opposing surfaces of the substrate.

24. The metallized laminate material of claim 14, wherein the photoresist is an epoxy photoresist.

25. The metallized laminate material of claim 24, wherein the photoresist layers have a thickness of about 8 to 12 microns.

26. A metallized laminate material for use in the manufacture of a printed wiring board having a pitch defining a minimum spacing between centers of adjacent circuit traces on the manufactured board, the metallized laminate material comprising:

(a) a dielectric polymeric film substrate, the substrate having opposing first and second sides and including a plurality of vias arranged in an ordered distribution having a pitch defining a minimum spacing between centers of adjacent vias, and wherein each via has a diameter which is between 10 and 50 percent of the pitch of the manufactured board, and each via includes a wall defining a through hole extending between the opposing first and second sides of the substrate; and (b) an electrically conductive material adhesivelessly deposited on the opposing first and second sides of the substrate and on the via walls, wherein the conductive material in the vias and on the opposing first and second sides of the substrate is adhered to the substrate through a layer of non-continuous random distributions of metal-oxide selected from the group consisting of oxides of iron, chromium, nickel, molybdenum, manganese, zirconium or mixtures thereof, and wherein the conductive material in the vias and on the opposing first and second sides of the substrate comprises a first metal layer, formed on the random distributions by vapor metallization, having a thickness of about 50 to 500 nanometers, and a second metal layer electroplated on the first metal layer, wherein the first and second metal layers have a thickness of less than or equal to about 35 microns and cover the opposing first and second sides of the substrate.

27. The metallized laminate material of claim 26, wherein the conductive material in the vias and on the opposing first and second sides of the substrate has a thickness of less than or equal to about 5 microns.

* * * * *